United States Patent
Lin et al.

(10) Patent No.: US 10,485,123 B1
(45) Date of Patent: Nov. 19, 2019

(54) DOUBLE-LEVER HANDLE

(71) Applicant: HONGFUJIN PRECISION ELECTRONICS (TIANJIN) CO., LTD., Tianjin (CN)

(72) Inventors: Jia-Feng Lin, New Taipei (TW); Chieh-Hsiang Lin, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/260,422

(22) Filed: Jan. 29, 2019

(30) Foreign Application Priority Data

Jan. 11, 2019 (CN) .......................... 2019 1 0028651

(51) Int. Cl.
*H05K 7/00* (2006.01)
*H05K 5/02* (2006.01)
*H05K 7/14* (2006.01)

(52) U.S. Cl.
CPC .......... *H05K 5/023* (2013.01); *H05K 5/0221* (2013.01); *H05K 5/0295* (2013.01); *H05K 7/1405* (2013.01); *H05K 7/1409* (2013.01); *H05K 7/1418* (2013.01)

(58) Field of Classification Search
None
See application file for complete search history.

(56) References Cited

U.S. PATENT DOCUMENTS

| 7,201,520 | B2 * | 4/2007 | Mizue | G02B 6/4277 385/92 |
| 8,040,687 | B2 * | 10/2011 | Pirillis | H05K 7/1412 361/801 |
| 8,256,737 | B2 * | 9/2012 | Stango | G05G 5/005 248/274.1 |
| 9,265,173 | B1 * | 2/2016 | Jhang | G11B 33/128 |
| 9,795,050 | B2 * | 10/2017 | Chen | G11B 33/142 |
| 10,225,940 | B2 * | 3/2019 | Spencer | G06F 1/181 |
| 10,278,298 | B2 * | 4/2019 | De Vis | H04Q 1/026 |
| 2006/0168759 | A1 * | 8/2006 | Laursen | H04Q 1/09 16/358 |
| 2007/0223207 | A1 * | 9/2007 | Nguyen | G06F 1/181 361/801 |

* cited by examiner

*Primary Examiner* — Courtney L Smith
*Assistant Examiner* — Rashen E Morrison
(74) *Attorney, Agent, or Firm* — ScienBiziP, P.C.

(57) ABSTRACT

A double-lever handle includes a main handle and an assisting handle. The main handle is rotationally mounted to a support body to form a first rotating pair. The assisting handle includes a power arm portion. The power arm portion is rotationally coupled to an end of the main handle away from the first rotating pair to form a second rotating pair. An end of the main handle adjacent to the first rotating pair defines a first latching slot. The main handle rotates about a first latching pin latched in the first latching slot. An end of the power arm adjacent to the second rotating pair defines a second latching slot. The power arm rotates about a second latching pin latched in the second latching slot.

16 Claims, 8 Drawing Sheets

Relevant art

FIG. 8

DOUBLE-LEVER HANDLE

FIELD

The subject matter herein generally relates to power supplies, and more particularly to a power supply for an electronic device.

BACKGROUND

Generally, high-frequency expansion cards are inserted or pulled out of a chassis by a single-lever structure. As the high-frequency expansion cards are made with higher numbers of terminals, it becomes more difficult to insert and pull out the high-frequency expansion card. Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 1:
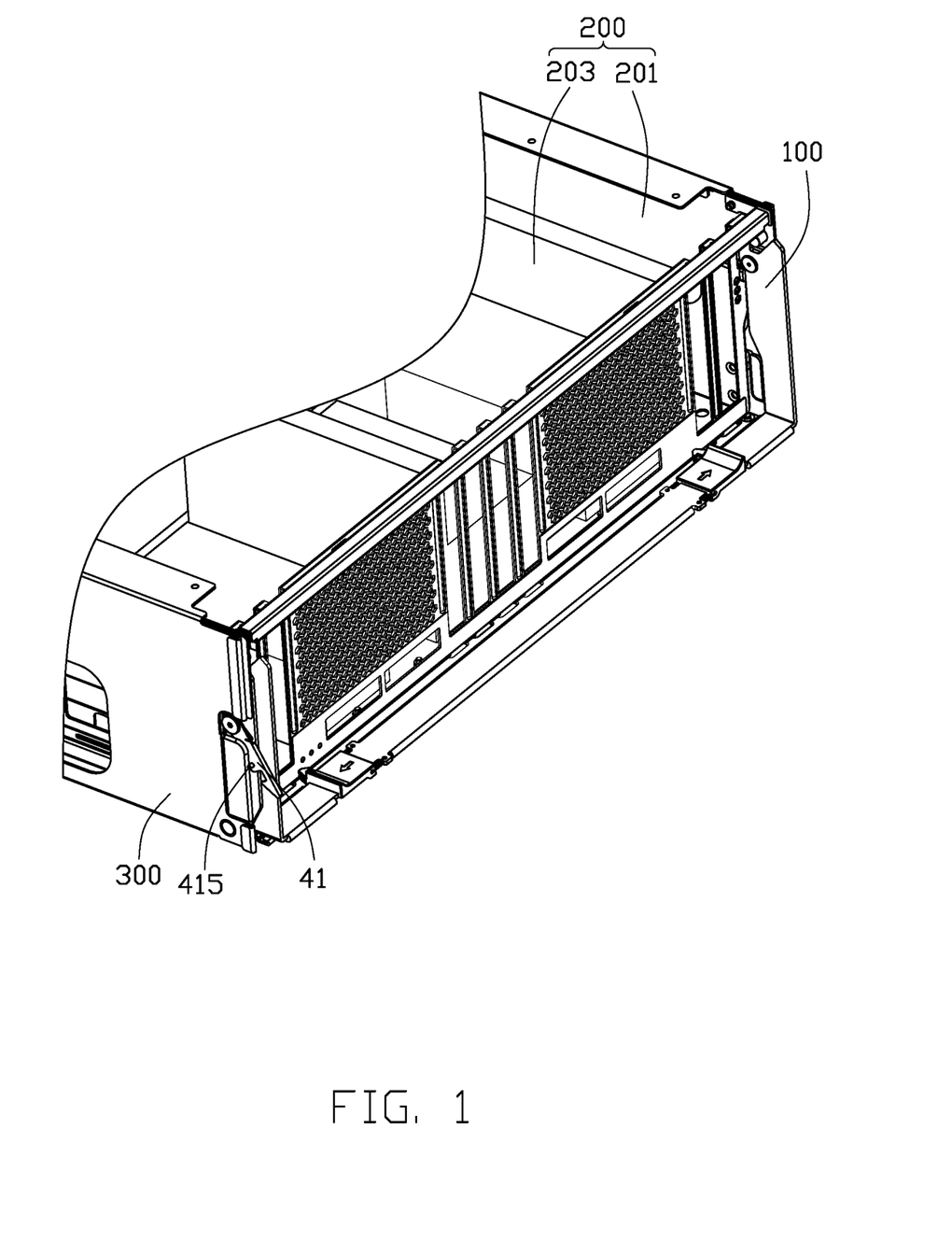
FIG. 1 is a partial isometric view of an embodiment of an installation body and an expansion card.

FIG. 1 shows an embodiment of an expansion card 200 including a support body 201, a plurality of male connectors 203, and a double-lever handle 100. The male connectors 203 are arranged on the support body 201. The double-lever handle 100 is used for inserting or pulling the support body 201 from one side of an installation body 300 to plug the plurality of male connectors 203 into corresponding female connectors (not shown) of the installation body 300. In one embodiment, the installation body 300 is a chassis, but is not limited thereto.

Figure 2:
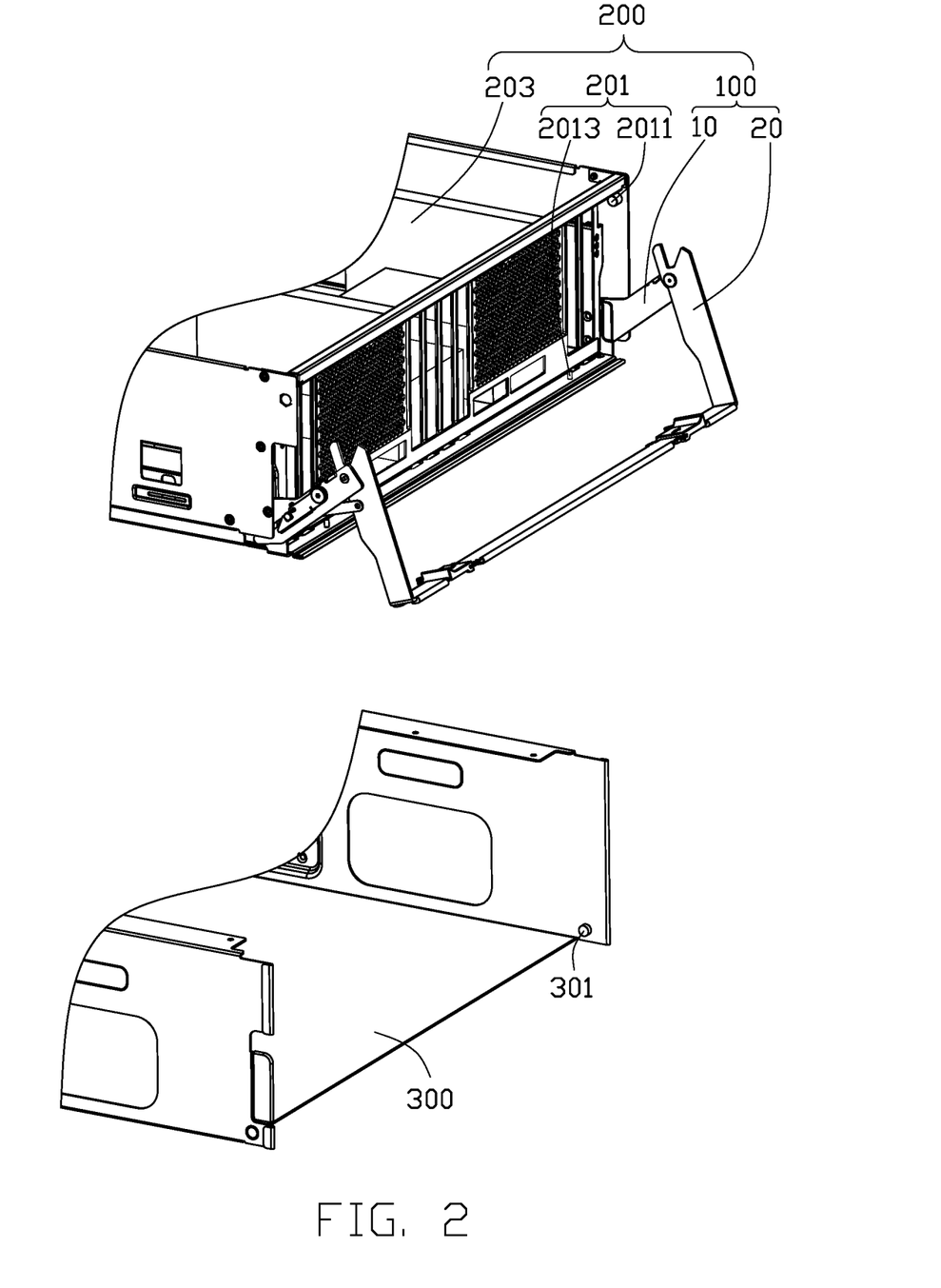
FIG. 2 is an exploded view of the installation body and the expansion card in FIG. 1.
Figure 3:
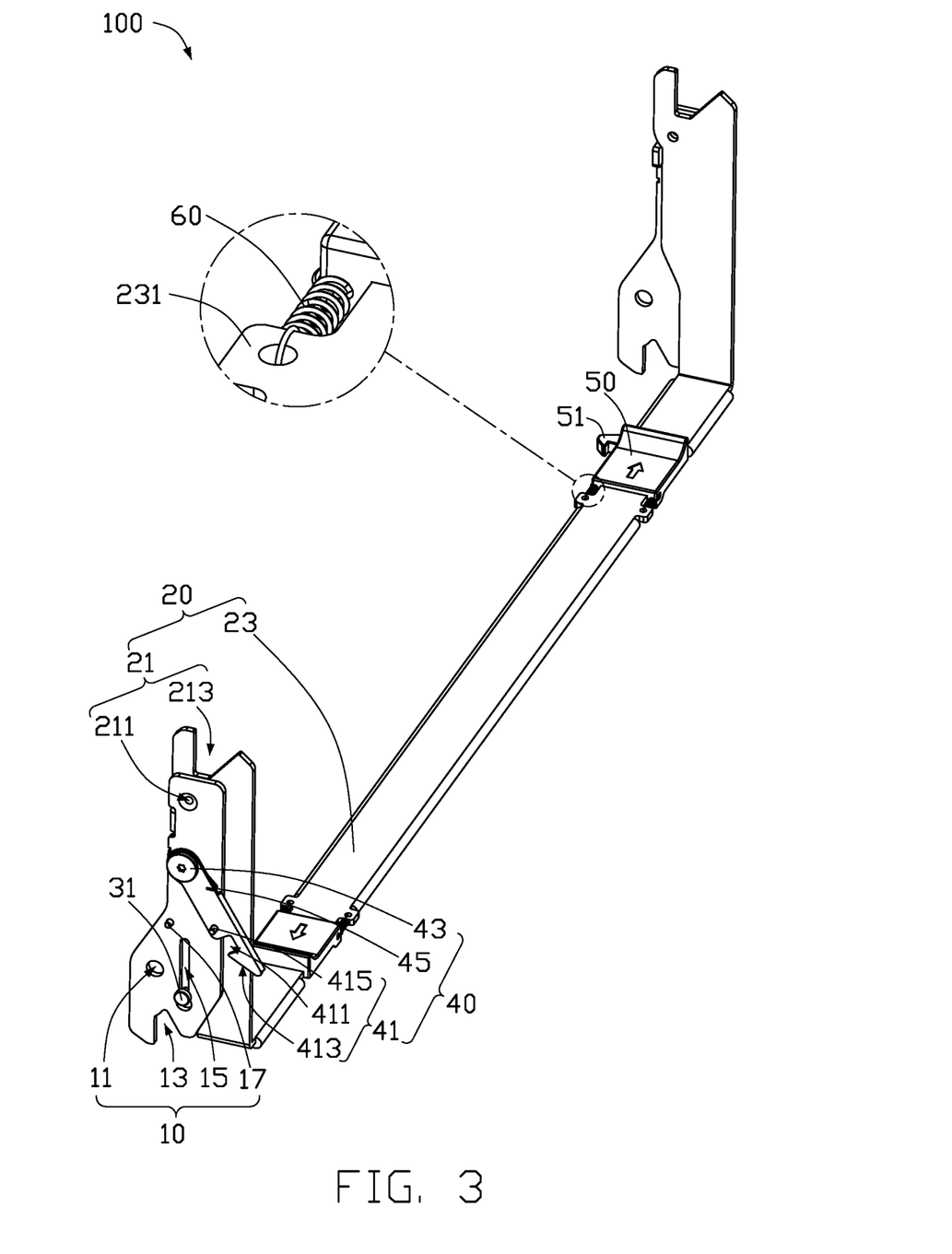
FIG. 3 is an isometric view of a double-lever handle in FIG. 1.

Referring to FIGS. 2 and 3, the double-lever handle 100 includes at least one main handle 10 and an assisting handle 20. The main handle 10 is rotationally mounted to the support body 201 to form a first rotating pair 11. The assisting handle 20 includes at least one power arm portion 21. In one embodiment, a number of the power arm portion 21 and the main handle 10 is the same, but is not limited thereto. The two power arm portions 21 are spaced apart and extend toward each other to form a connecting beam 23. Each of the power arm portions 21 is rotationally coupled to one end of the main handle 10 away from the first rotation pair 11 to form a second rotation pair 211.

Referring to FIG. 3, an end of the main handle 10 adjacent to the first rotating pair 11 defines a first latching slot 13. The installation body 300 includes a first latching pin 301 corresponding to the first latching slot 13. The first latching slot 13 can latch the first latching pin 301, and the main handle 10 can be rotated about the first latching pin 301. An end of the power arm portion 21 adjacent to the second rotating pair 211 defines a second latching slot 213. The connecting beam 23 is coupled between the two power arm portions 21. The support body 201 includes a second latching pin 2011 corresponding to the second latching slot 213. The second latching slot 213 can latch the second latching pin 2011, and the power arm portion 21 can rotate about the second latching pin 2011.

Figure 4:
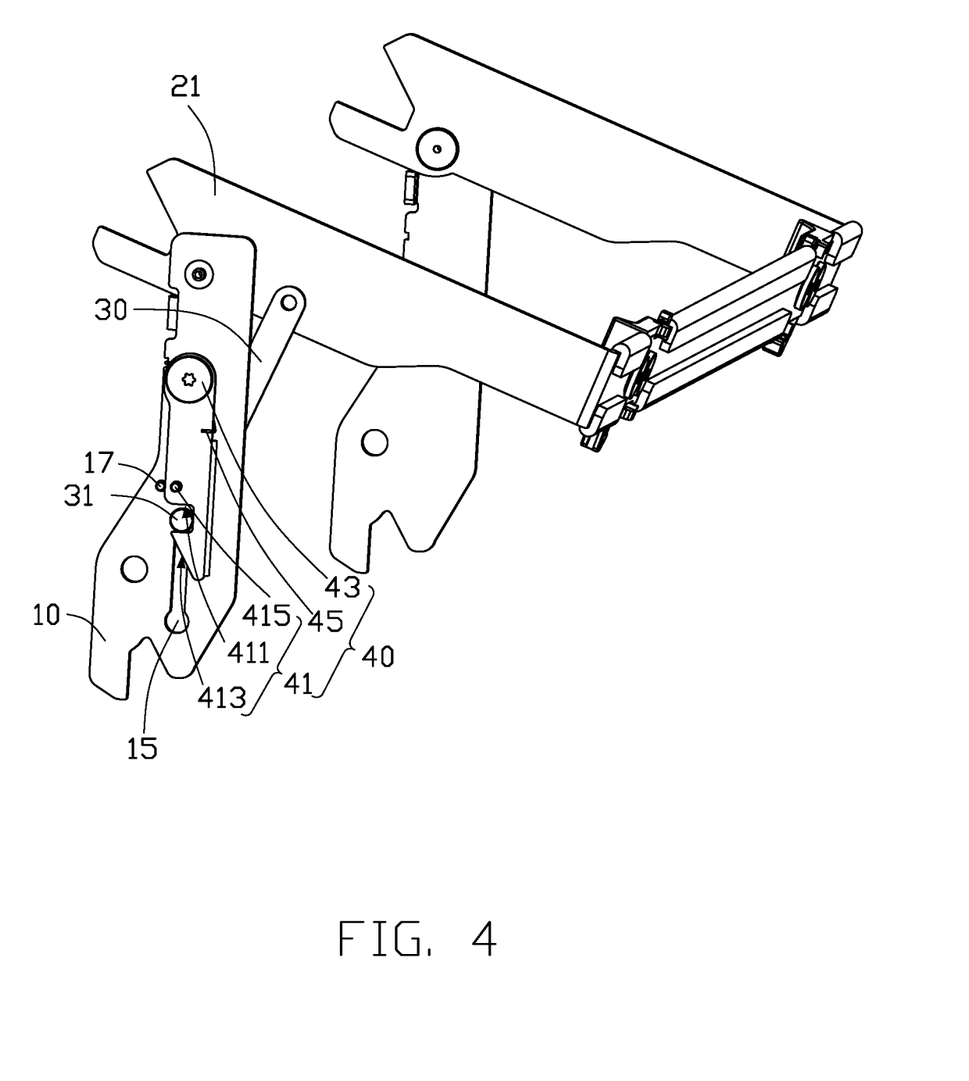
FIG. 4 shows the double-lever handle in a pulled out state.

Referring to FIG. 3 and FIG. 4, in one embodiment, the double-lever handle 100 further includes at least one connecting rod 30. One end of the connecting rod 30 is rotationally coupled to the power arm portion 21. A second end of the connecting rod 30 is slidably coupled to the main handle 10. The main handle 10 defines a sliding slot 15, and a sliding block 31 is protruded from one end of the connecting rod 30. The sliding block 31 can be inserted into the sliding groove 15 and slide along the sliding groove 15. The connecting rod 30 increases durability of the double-lever handle 100. In other embodiments, the connecting rod 30 may be omitted.

In one embodiment, the double-lever handle 100 further includes at least one fastener 40. The fastener 40 includes a pivoting hook 41, a shaft 43, and a torsion spring 45. The shaft 43 is arranged on the main handle 10. The pivoting hook 41 is rotationally coupled to the shaft 43. The torsion spring 45 is sleeved over the shaft 43. The main handle 10 includes a first stopping pin 17. Two ends of the torsion spring 45 are respectively coupled to the main handle 10 and the pivoting hook 41 to bias the pivoting hook 41 toward the installation body 300 and resist against the first stopping pin 17 to restrict a rotation angle of the pivoting hook 41.

The pivoting hook 41 defines a third latching slot 411 facing the sliding block 31. The sliding block 31 is configured to latch with the third latching slot 411. The pivoting hook 41 includes a guiding portion 413. The third latching slot 411 is located between the shaft 43 and the guiding portion 413. When the sliding block 31 moves along the sliding groove 15 toward the shaft 43, the sliding block 31 slides along a surface of the guiding portion 413 until the sliding block 31 is aligned with the third latching slot 411, and then the torsion spring 45 drives the pivoting hook 41 to latch the sliding block 31 in the third latching slot 411, thereby locking the main handle 10 and the power arm portion 21 at an angle.

The pivoting hook 41 further includes a second stopping pin 415. When the support body 201 is inserted into the installation body 300, the second stopping pin 415 is resisted by a wall of the installation body 300 to disengage the sliding block 31 from the third latching slot 411 (as shown in FIG. 1). When the double-lever handle 100 is in a pulled-out state, the main handle 10 and the power arm portion 21 are locked to facilitate holding of the double-lever handle 100 to drive the support body 201 to move toward or away from the installation body 300. In other embodiments, the fastener 40 may be omitted.

Referring to FIG. 2 and FIG. 3, the double-lever handle 100 further includes at least one buckle 50 and a plurality of resilient members 60. The support body 201 includes at least one pin 2013. In one embodiment, a number of the buckle 50 and the pin 2013 is two, and the number of the resilient members 60 is four, but is not limited thereto. The two buckles 50 are slidably spaced apart from the connecting beam 23. The buckle 50 includes a hook 51. The connecting beam 23 includes a stopper boss 231 corresponding to each of the resilient members 60. Two ends of each resilient member 60 are respectively coupled to the buckle 50 and the corresponding stopper boss 231. The resilient member 60 drives the buckle 50 to move toward the stopper boss 231 to latch the hook 51 on the pin 2013, thereby preventing the power arm portion 21 from rotating, so that the double-lever handle 100 is locked on the support body 201, and a connection between the male connector 203 and the corresponding female connector is improved. In other embodiments, the pin 2013 and the hook 51 may also be omitted.

In one embodiment, the resilient member 60 is a tension spring, but is not limited thereto. In other embodiments, the resilient member 60 may be a rubber band or the like. In other embodiments, the resilient member 60 may be omitted.

Figure 5:
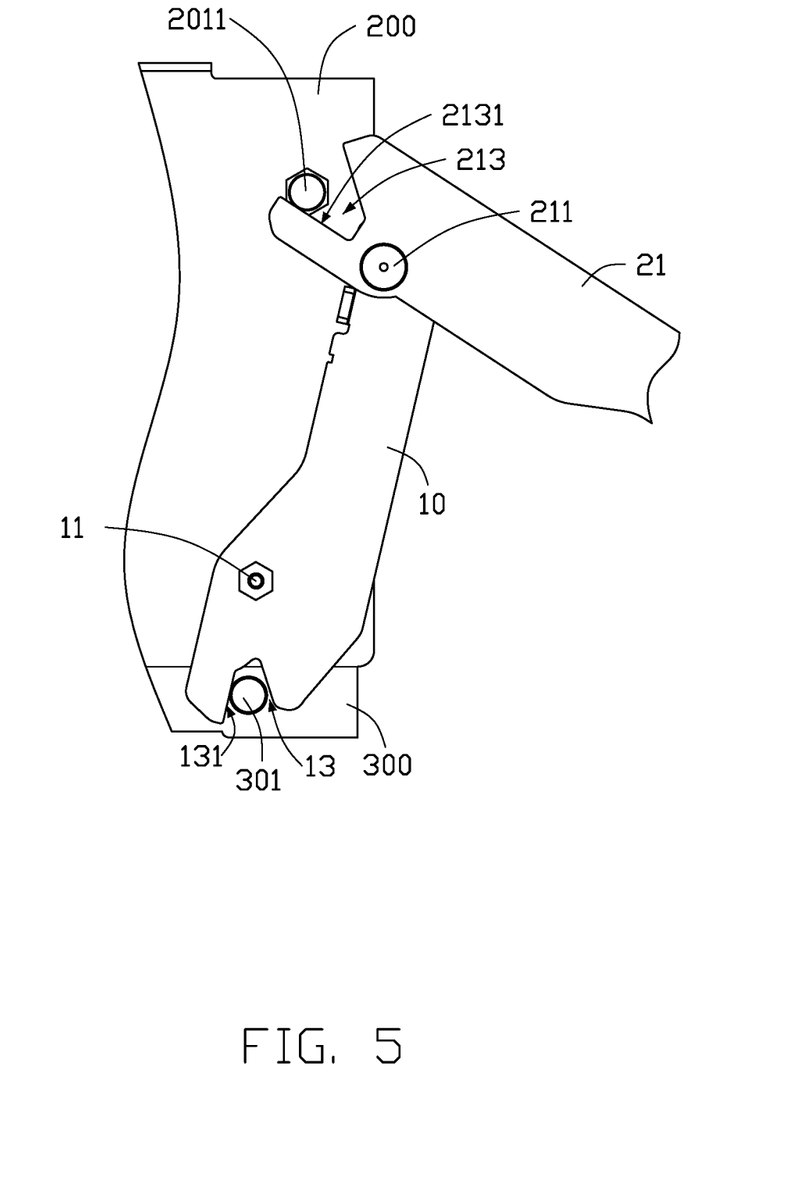
FIG. 5 is a side view showing the double-lever handle pushing a support body into the installation body.

Referring to FIG. 5, when the support body 201 is inserted from one side of the installation body 300, the connecting beam 23 is gripped, and the support body 201 is driven into the installation body 300 until the installation body 300 resists against the second stopping pin 415 to cause the sliding block 31 to disengage from the third latching slot 411, thereby unlocking the main handle 10 and the power arm portion 21. A free end of the power arm portion 21 drives the support body 201 to move toward the installation body 300, and the free end of the power arm portion 21 rotates clockwise around the second rotating pair 211 toward the main handle 10 to adjust an angle of the main handle 10 and the power arm portion 21 such that the first latching slot 13 latches the first latching pin 301 and the second latching slot 213 latches the second latching pin 2011. When the free end of the power arm portion 21 is continued to rotate clockwise around the second rotating pair 211, a third slot wall 2131 of the second slot 213 adjacent to the installation body 300 abuts against a peripheral wall of the second latching pin 2011 and rotates clockwise along the peripheral wall of the second latching pin 2011 to cause the main handle 10 to continue to rotate counterclockwise around the first rotating pair 11. A first slot wall 131 of the first latching slot 13 adjacent to the installation body 300 rotates counterclockwise along the peripheral wall of the first latching pin 301 to cause the support body 201 to continue to move toward the installation body 300 to plug the male connector 203 into the female connector. The buckle 50 latches the hook 51 to the pin 2013 to lock the double-lever handle 100 to the support body 201.

Figure 6:
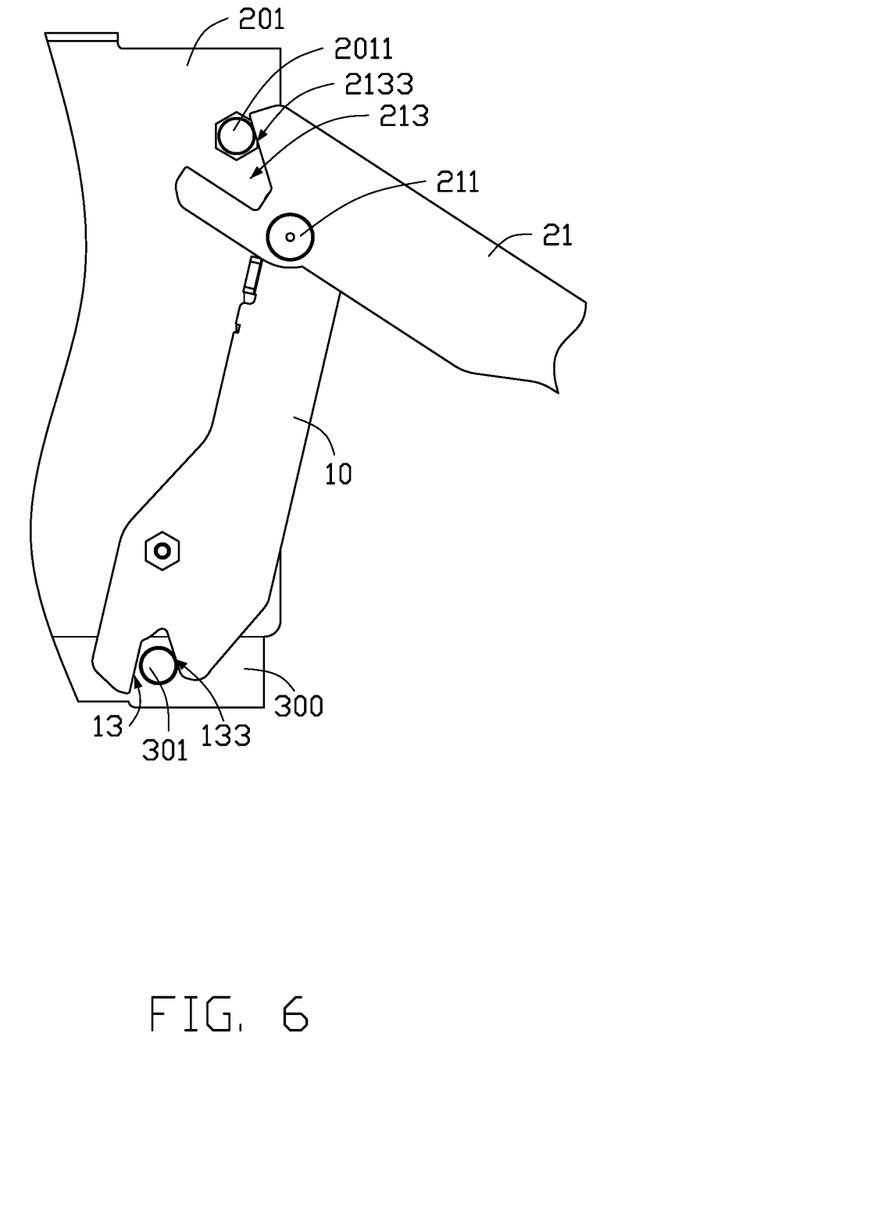
FIG. 6 is a side view showing the double-lever handle pulling the support body from the installation body.

Referring to FIG. 6, when the support body 201 is pulled from the side of the installation body 300, the buckle 50 releases the hook 51 from the pin 2013, and the double-lever handle 100 and the support body 201 are unlocked. The free end of the power arm portion 21 is rotated counterclockwise about the second rotating pair 211 (away from the main handle 10). A fourth slot wall 2133 of the second latching slot 213 opposite to the third slot wall 2131 rotates counterclockwise along the peripheral wall of the second latching pin 2011 to rotate the main handle 10 clockwise around the first rotation pair 11. The second slot wall 133 of the first slot 13 opposite to the first slot wall 131 rotates clockwise along the peripheral wall of the second latching pin 2011 to drive the support body 201 to move away from the installation body 300, so that the male connector 203 is unplugged from the female connector. The free end of the driving force arm 21 continues to move in a counterclockwise direction to disengage the first latching slot 13 from the first latching pin 301 and the second latching slot 213 from the second latching pin 611, and the sliding block 31 slides along the sliding groove 15 toward the shaft 43 until the sliding block 31 is latched in the third latching slot 411, thereby locking the main handle 10 and the power arm portion 21. The connecting beam 23 is pulled to move the support body 201 away from the installation body 300 to eject the support body 201 from the installation body 300.

In other embodiments, the number of the main handle 10 and the power arm portion 21 may be one, such that the connecting beam 23 is omitted.

Figure 7:
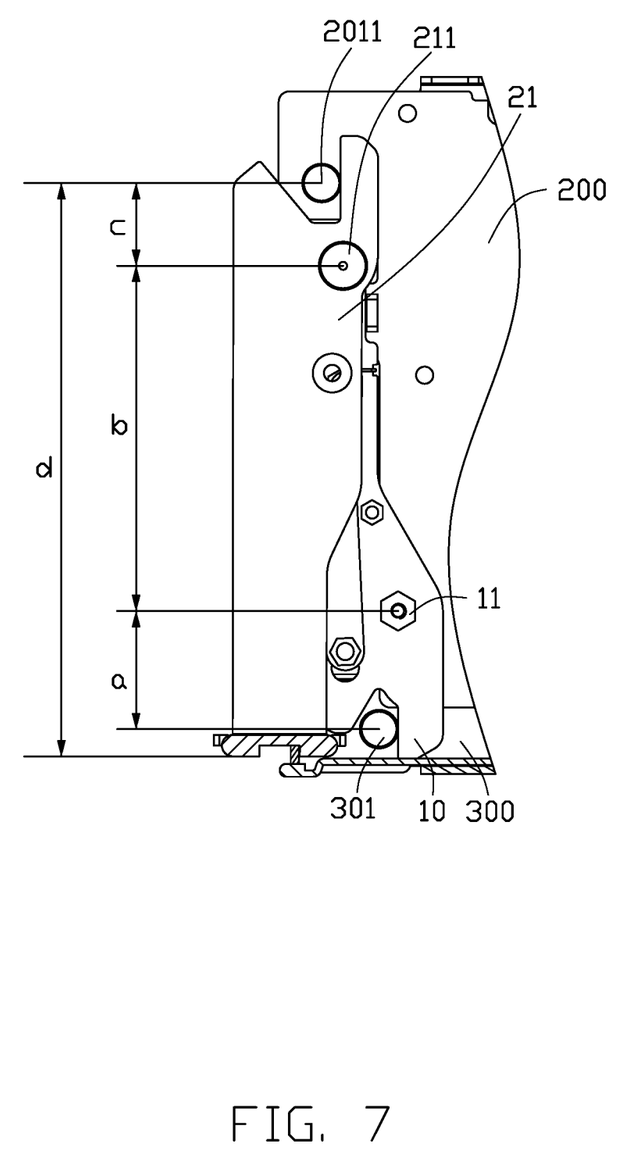
FIG. 7 is a schematic view showing a principle of force analysis of the double-lever handle.

Referring to FIG. 7, according to a principle of a lever, a fulcrum of the main handle 10 is defined as the first rotating pair 11, a resistance acting point is defined as the first latching pin 301, and a power acting point is defined as the second rotating pair 211. The fulcrum can further be defined as the second rotating pair 211, the resistance acting point can further be defined as the second latching pin 2011, and the dynamic acting point can further be defined as a sidewall of the connecting beam 23. A plug resistance is m multiplied by a force applied to the double-lever handle 100. Thus, m=(first power arm b/first resistance arm a)×(second power arm d/second resistance arm c), wherein the first power arm b is larger than the first resistance arm a, and the second power arm d is larger than the second resistance arm c.

Figure 8:
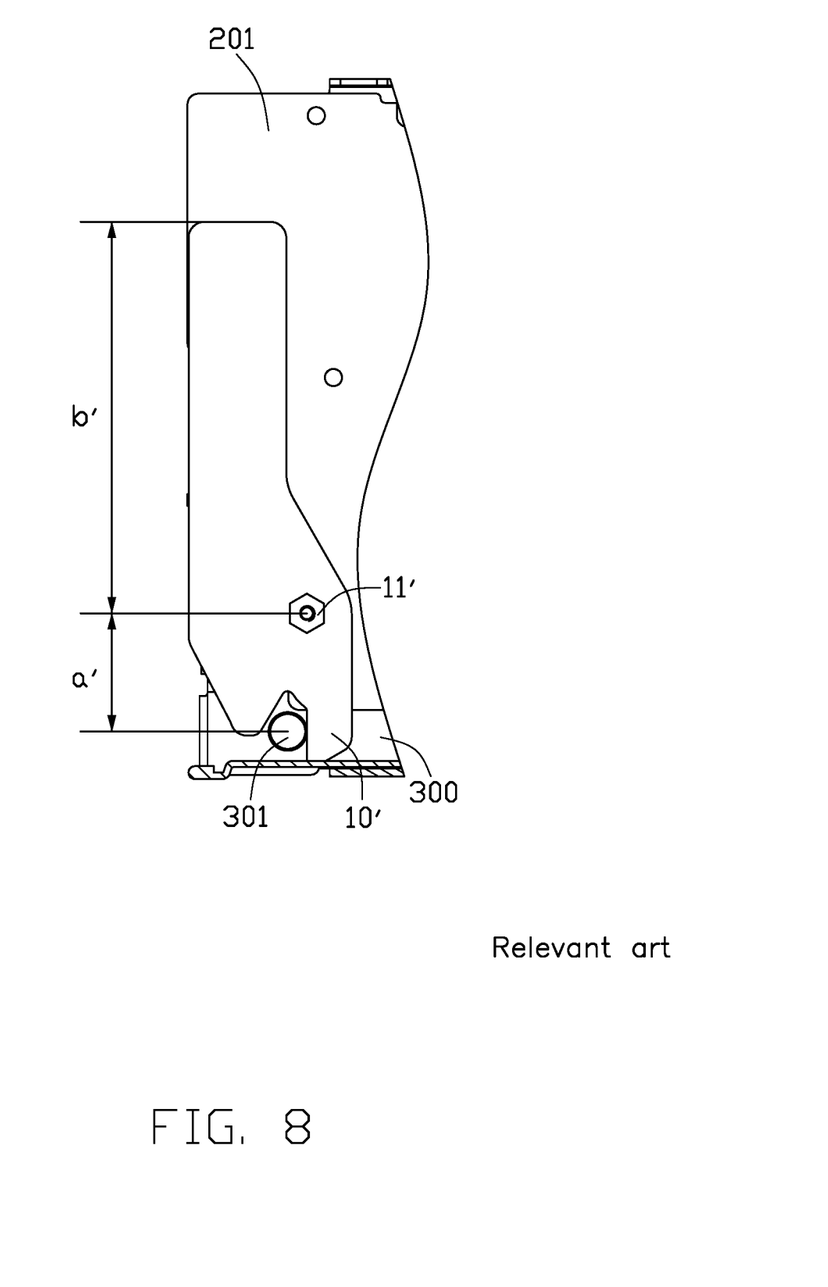
FIG. 8 is a schematic view showing a principle of force analysis of a single-lever handle of the related art.

Referring to FIG. 8, the related art is rotationally mounted to the support body 201 using a single main handle 10'. According to the principle of the lever, the fulcrum of the main handle 10' is defined as a first rotating pair 11', the resistance action point is defined as the first latching pin 301, and the power acting point is defined as a sidewall of the main handle 10' away from the first latching pin 301. The plug resistance is n multiplied by the force applied to the main handle 10'. Thus, n=(first power arm b'/first resistance arm a'). Thus, m is significantly larger than n, so a force required to be applied to the double-lever handle 100 is much smaller than a force applied to the main handle 10'.

The double-lever handle 100 is rotationally mounted to the support body 201 by the main handle 10, and the power arm portion 21 is rotationally coupled to the main handle 10. The first latching slot 13 latches the first latching pin 301 and rotates about the first latching pin 301. The second latching slot 213 latches the second latching pin 2011 and rotates about the second latching pin 2011 to form a double-lever structure including the main handle 10 and the power arm portion 21, which effectively reduces a required force to be applied to the double-lever handle 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A double-lever handle configured to push a support body into an installation body or pull the support body from the installation body, the double-lever handle comprising:
    at least one main handle;
    at least one assisting handle; and
    at least one connecting rod; wherein:
    the main handle is rotationally mounted to the support body, and a connecting portion between the main handle and the support body forms a first rotating pair;
    the assisting handle comprises at least one arm;
    the arm is rotationally coupled to an end of the main handle away from the first rotating pair, and a connecting portion between the arm portion and the main handle forms a second rotating pair;
    another end of the main handle adjacent to the first rotating pair defines a first latching slot;
    the first latching slot is configured to latch a first latching pin of the installation body;
    the main handle is configured to rotate about the first latching pin latched in the first latching slot;
    an end of the arm adjacent to the second rotating pair defines a second latching slot;
    the second latching slot is configured to latch a second latching pin of the support body;
    the arm is configured to rotate about the second latching pin latched in the second latching slot;
    one end of the connecting rod is rotationally coupled to the arm, and a second end of the connecting rod is slidably coupled to the main handle.

2. The double-lever handle of claim 1, wherein:
    the main handle defines a sliding groove;
    one end of the connecting rod comprises a sliding block;
    the sliding block is configured to be inserted into and slide along the sliding groove.

3. The double-lever handle of claim 2 further comprising a fastener, wherein:
    the fastener comprises a pivoting hook and a shaft;
    the shaft is mounted to the main handle;
    the pivoting hook is rotationally coupled to the shaft;
    the pivoting hook defines a third latching slot facing the sliding block;
    the sliding block is configured to slide along the sliding groove to be latched in the third latching slot or disengage from the third latching slot.

4. The double-lever handle of claim 3, wherein:
    the fastener further comprises a torsion spring;
    the main handle comprises a first stopping pin;
    the torsion spring is sleeved over the shaft;
    two ends of the torsion spring are respectively mounted to the main handle and the pivoting hook;
    the torsion spring biases the pivoting hook toward the installation body to resist against the first stopping pin.

5. The double-lever handle of claim 3, wherein:
    an end of the pivoting hook away from the shaft comprises a guiding portion;
    when the sliding block slides along the sliding groove toward the shaft, the sliding block slides along a surface of the guiding portion;
    when the sliding block is aligned with the third latching slot, the torsion spring drives the pivoting hook to latch the sliding block within the third latching slot.

6. The double-lever handle of claim 3, wherein:
    the pivoting hook comprises a second stopping pin;
    the second stopping pin resists against the installation body.

7. The double-lever handle of claim 6 further comprising at least one buckle, wherein:
    the arm comprises a connecting beam extending from one side of the arm;
    the at least one buckle comprises a hook;
    the buckle is slidably coupled to the connecting beam to cause the hook to latch with a pin of the support body.

8. The double-lever handle of claim 7 further comprising a plurality of resilient members, wherein each of the resilient members is resiliently coupled between the connecting beam and the buckle.

9. An expansion card comprising a support body, a plurality of male connectors mounted to the support body, and a double-lever handle, the double-lever handle configured to push the support body into an installation body or pull the support body from the installation body, the double-lever handle comprising:
    at least one main handle;
    at least one assisting handle; and
    at least one connecting rod; wherein:
    the main handle is rotationally mounted to the support body, and a connecting portion between the main handle and the support body forms a first rotating pair;
    the assisting handle comprises at least one arm;
    the arm is rotationally coupled to an end of the main handle away from the first rotating pair, and a connecting portion between the arm portion and the main handle forms a second rotating pair;
    another end of the main handle adjacent to the first rotating pair defines a first latching slot;
    the first latching slot is configured to latch a first latching pin of the installation body;
    the main handle rotates about the first latching pin latched in the first latching slot;
    an end of the arm adjacent to the second rotating pair defines a second latching slot;
    the support body comprises a second latching pin configured to be latched in the second latching slot;
    the arm rotates about the second latching pin latched in the second latching slot;
    one end of the connecting rod is rotationally coupled to the arm, and a second end of the connecting rod is slidably coupled to the main handle.

10. The expansion card of claim 9, wherein:
    the main handle defines a sliding groove;
    one end of the connecting rod comprises a sliding block;
    the sliding block is configured to insert into and slide along the sliding groove.

11. The expansion card of claim 10, wherein:
    the double-lever handle further comprises a fastener;
    the fastener comprises a pivoting hook and a shaft;
    the shaft is mounted to the main handle;
    the pivoting hook is rotationally coupled to the shaft;

the pivoting hook defines a third latching slot facing the sliding block;

the sliding block is configured to slide along the sliding groove to be latched in the third latching slot or disengage from the third latching slot.

12. The expansion card of claim 11, wherein:

the fastener further comprises a torsion spring;

the main handle comprises a first stopping pin;

the torsion spring is sleeved over the shaft;

two ends of the torsion spring are respectively mounted to the main handle and the pivoting hook;

the torsion spring biases the pivoting hook toward the installation body to resist against the first stopping pin.

13. The expansion card of claim 11, wherein:

an end of the pivoting hook away from the shaft comprises a guiding portion;

when the sliding block slides along the sliding groove toward the shaft, the sliding block slides along a surface of the guiding portion;

when the sliding block is aligned with the third latching slot, the torsion spring drives the pivoting hook to latch the sliding block within the third latching slot.

14. The expansion card of claim 11, wherein:

the double-lever handle further comprises at least one buckle;

the arm comprises a connecting beam extending from one side of the arm;

the at least one buckle comprises a hook;

the buckle is slidably coupled to the connecting beam to cause the hook to latch with a pin of the support body.

15. The expansion card of claim 9, wherein:

the arm comprises a connecting beam extending from one side of the arm;

the support body comprises at least one pin;

the buckle comprises a hook facing the pin;

the buckle is slidably coupled to the connecting beam to cause the hook to latch with the pin.

16. The expansion card of claim 15, wherein:

the double-lever handle further comprises a plurality of resilient members;

each of the resilient members is resiliently coupled between the connecting beam and the buckle.

* * * * *